(12) United States Patent
In et al.

(10) Patent No.: US 11,574,587 B2
(45) Date of Patent: Feb. 7, 2023

(54) DISPLAY DEVICE

(71) Applicant: Samsung Display Co., LTD., Yongin-si (KR)

(72) Inventors: Hai Jung In, Yongin-si (KR); Ki Myeong Eom, Yongin-si (KR)

(73) Assignee: Samsung Display Co., LTD., Yongin-si (KR)

( * ) Notice: Subject to any disclaimer, the term of this patent is extended or adjusted under 35 U.S.C. 154(b) by 0 days.

(21) Appl. No.: 17/831,440

(22) Filed: Jun. 3, 2022

(65) Prior Publication Data

US 2022/0392400 A1     Dec. 8, 2022

(30) Foreign Application Priority Data

Jun. 4, 2021 (KR) .................. 10-2021-0072604

(51) Int. Cl.
*G09G 3/32*        (2016.01)

(52) U.S. Cl.
CPC ....... *G09G 3/32* (2013.01); *G09G 2300/0426* (2013.01); *G09G 2300/0809* (2013.01); *G09G 2310/0267* (2013.01); *G09G 2310/061* (2013.01); *G09G 2310/08* (2013.01)

(58) Field of Classification Search
CPC ............. G09G 3/32; G09G 2300/0426; G09G 2300/0809; G09G 2310/0267; G09G 2310/061; G09G 2310/08
See application file for complete search history.

(56) References Cited

U.S. PATENT DOCUMENTS

| 7,250,788 | B2 | 7/2007 | Lee et al. | |
|---|---|---|---|---|
| 10,453,386 | B2 | 10/2019 | Jang | |
| 10,586,494 | B2 | 3/2020 | Bong et al. | |
| 2017/0337877 | A1* | 11/2017 | Kim | G09G 3/3233 |
| 2018/0197464 | A1* | 7/2018 | Yamamoto | G09G 3/3266 |
| 2019/0027093 | A1* | 1/2019 | Choi | H01L 27/3265 |
| 2019/0130841 | A1* | 5/2019 | Yoon | G09G 3/3266 |
| 2019/0139508 | A1* | 5/2019 | Park | G09G 3/20 |
| 2019/0279589 | A1* | 9/2019 | Kusumi | G09G 3/3677 |
| 2021/0082332 | A1* | 3/2021 | Morita | G09G 3/20 |
| 2021/0312879 | A1* | 10/2021 | Huang | G11C 19/28 |
| 2021/0335168 | A1 | 10/2021 | Lee et al. | |

FOREIGN PATENT DOCUMENTS

| KR | 10-1056375 | 8/2011 |
|---|---|---|
| KR | 10-2017-0047631 | 5/2017 |
| KR | 10-2020-0026385 | 3/2020 |

* cited by examiner

*Primary Examiner* — Andrew Sasinowski

(74) *Attorney, Agent, or Firm* — H.C. Park & Associates, PLC

(57) ABSTRACT

A display device includes a display panel including gate lines and pixels connected to the gate lines, and a gate driver including plural stages providing gate signals to the gate lines. A first stage among the stages includes a node controller including an input terminal and configured to control a voltage of a first control node and a voltage of a second control node, and an output unit connected to a first gate power source line and configured to output a first gate power source voltage of the first gate power source line as a gate signal through an output terminal in response to the voltage of the first control node. The node controller includes a first auxiliary transistor connected in the form of a diode between the input terminal and the second control node and a boosting capacitor connected between the second control node and the output terminal.

20 Claims, 9 Drawing Sheets

DISPLAY DEVICE

CROSS-REFERENCE TO RELATED APPLICATION

The application claims priority from and the benefit of Korean Patent Application No. 10-2021-0072604, filed on Jun. 4, 2021, which is hereby incorporated by reference for all purposes as if fully set forth herein.

BACKGROUND

Field

Embodiments of the invention relate generally to a display device.

Discussion of the Background

A display device includes a data driver, a gate driver, and pixels. The data driver provides data signals to the pixels through data lines. The gate driver generates a gate signal using a gate power source and a clock signal provided from outside, and sequentially provides is the gate signal to the pixels through gate lines. For example, the gate driver outputs the gate power source as the gate signal of a turn-on level in response to the clock signal. Each of the pixels may receive a corresponding data signal in response to the gate signal and emit light in response to the data signal.

The above information disclosed in this Background section is only for understanding of the background of the inventive concepts, and, therefore, it may contain information that does not constitute prior art.

SUMMARY

Devices constructed according to illustrative implementations of the invention are capable of having an improved image display capability by having a reduced deviation in luminance amongst pixels.

The gate signal may not immediately transition from a high level to a low level due to a threshold voltage of a transistor included in the gate driver (or a stage circuit), but may have a middle level and may be transitioned in a step form. That is, if there is a deviation in threshold voltages of transistors, a deviation of the gate signal may occur for each gate line.

When a deviation occurs between gate signals, a difference in luminance may occur because it affects the operation of transistors of a pixel circuit controlled by the gate signal. As a result, a horizontal stripe defect may be visually recognized by a user of the display device.

A technical problem to be solved by the present invention (i.e., an inventive concept) is to provide a display device capable of reducing or preventing a deviation in luminance caused by a change in a gate signal by compensating for an output deviation of a gate signal.

Additional features of the inventive concepts will be set forth in the description which follows, and in part will be apparent from the description, or may be learned by practice of the inventive concepts.

In order to solve the above technical problems, a display device according to an embodiment may comprise a display panel that includes gate lines and pixels connected to the gate lines; and a gate driver that includes a plurality of stages providing gate signals to the gate lines.

A first stage among the stages may comprise a node controller that includes an input terminal and controlling a voltage of a first control node and a voltage of a second control node; and an output unit connected to a first gate power source line and outputting a first gate power source voltage of the first gate power source line as a gate signal through an output terminal in response to the voltage of the first control node. The node controller may comprise a first auxiliary transistor connected in the form of a diode between the input terminal and the second control node and a boosting capacitor connected between the second control node and the output terminal.

The voltage of the second control node may transition from a logic high level to a second logic low level lower than a first logic low level at a time point at which a signal applied to a first clock input terminal transitions from the logic high level to the first logic low level during a period in which a signal applied to the input terminal has the first logic low level, and maintain the second logic low level while the signal applied to the input terminal is maintained at the first logic low level.

The output unit may comprise a pull-up transistor that includes a first electrode connected to the first gate power source line, a second electrode connected to the output terminal, and a gate electrode connected to the first control node; and a pull-down transistor that includes a first electrode connected to the output terminal, a second electrode connected to a second gate power source line, and a gate electrode connected to the second control node.

The node controller may comprise a first clock input terminal and a second clock input terminal; a first transistor that includes a first electrode connected to the input terminal, a second electrode, and a gate electrode connected to the first clock input terminal; a second transistor that includes a first electrode connected to the first gate power source line, a second electrode, and a gate electrode; a third transistor that includes a first electrode connected to the second electrode of the second transistor, a second electrode connected to the second clock input terminal, and a gate electrode connected to a first electrode of the first auxiliary transistor; a fourth transistor that includes a first electrode connected to the gate electrode of the second transistor, a second electrode connected to the first clock input terminal, and a gate electrode connected to the second electrode of the first transistor; a fifth transistor that includes a first electrode connected to the first electrode of the fourth transistor, a second electrode connected to the second gate power source line, and a gate electrode connected to the first clock input terminal; a first coupling transistor that includes a first electrode connected to the first electrode of the fifth transistor, a second electrode, and a gate electrode connected to the second gate power source line; a first coupling capacitor that includes a first electrode connected to the second electrode of the first coupling transistor, and a second electrode; a sixth transistor that includes a first electrode connected to the first control node, a second electrode connected to the second electrode of the first coupling capacitor, and a gate electrode connected to the second clock input terminal; and a seventh transistor that includes a first electrode connected to the second electrode of the first coupling capacitor, a second electrode connected to the second clock input terminal, and a gate electrode connected to the first electrode of the first coupling capacitor.

The node controller may further comprise a second auxiliary transistor that includes a first electrode connected to the input terminal, a second electrode connected to the first electrode of the first auxiliary transistor, and a gate electrode connected to the second gate power source line.

The first auxiliary transistor may include the first electrode connected to the gate electrode of the third transistor, a second electrode connected to the second control node, and a gate electrode connected to the gate electrode of the third transistor.

The node controller may further comprise a third auxiliary transistor that includes a first electrode connected to the input terminal, a second electrode connected to the first electrode of the second auxiliary transistor, and a gate electrode connected to the first clock input terminal.

The node controller may further comprise a second coupling capacitor that includes a first electrode connected to the second electrode of the second transistor and a second electrode connected to the gate electrode of the third transistor; and a second coupling transistor that includes a first electrode connected to the second electrode of the first transistor, a second electrode connected to the second control node, and a gate electrode connected to the second gate power source line.

The first stage may further comprise an eighth transistor that includes a first electrode connected to the first gate power source line, a second electrode connected to the first control node, and a gate electrode connected to the second electrode of the first transistor; and a first capacitor that includes a first electrode connected to the first gate power source line and a second electrode connected to the first control node.

The first stage may further comprise a reset transistor that includes a first electrode connected to the first gate power source line, a second electrode connected to the second electrode of the first transistor, and a gate electrode connected to a reset line.

In order to solve the above technical problems, a display device according to an embodiment may comprise a display panel that includes gate lines and pixels connected to the gate lines; and a gate driver that includes a plurality of stages providing gate signals to the gate lines.

A first stage among the stages may comprise a node controller that includes an input terminal and controlling a voltage of a first control node and a voltage of a second control node; and an output unit connected to a first gate power source line and outputting a first gate power source voltage of the first gate power source line as a gate signal through an output terminal in response to the voltage of the first control node.

The node controller may comprise a feedback path between the output terminal and the second control node, and include a first auxiliary transistor connected in the form of a diode between the input terminal and the second control node, a boosting capacitor connected between the second control node and the output terminal, and a second auxiliary transistor connected between the output terminal and the boosting capacitor and controlling opening and closing of the feedback path, on the feedback path.

The voltage of the second control node may transition from a logic high level to a second logic low level lower than a first logic low level when a signal applied to a first clock input terminal transitions from the logic high level to the first logic low level during a period in which a signal applied to the input terminal has the first logic low level, and maintains the second logic low level while the signal applied to the input terminal is maintained at the first logic low level.

The output unit may comprise a pull-up transistor that includes a first electrode connected to the first gate power source line, a second electrode connected to the output terminal, and a gate electrode connected to the first control node; and a pull-down transistor that includes a first electrode connected to the output terminal, a second electrode connected to a second gate power source line, and a gate electrode connected to the second control node.

The node controller may further comprise a first clock input terminal and a second clock input terminal; a first transistor that includes a first electrode connected to the input terminal, a second electrode, and a gate electrode connected to the first clock input terminal; a second transistor that includes a first electrode, a second electrode connected to the first clock input terminal, and a gate electrode connected to the second electrode of the first transistor; a third transistor that includes a first electrode connected to the first electrode of the second transistor, a second electrode connected to the second gate power source line, and a gate electrode connected to the second electrode of the second transistor; a fourth transistor that includes a first electrode connected to the first gate power source line, a second electrode connected to a first electrode of the second auxiliary transistor, and a gate electrode connected to the second clock input terminal; a first coupling transistor that includes a first electrode connected to the first electrode of the third transistor, a second electrode, and a gate electrode connected to the second gate power source line; a first coupling capacitor that includes a first electrode connected to the second electrode of the first coupling transistor, and a second electrode; a sixth transistor that includes a first electrode connected to the first control node, a second electrode connected to the second electrode of the first coupling capacitor, and a gate is electrode connected to the second clock input terminal; and a seventh transistor that includes a first electrode connected to the second electrode of the first coupling capacitor, a second electrode connected to the second clock input terminal, and a gate electrode connected to the first electrode of the first coupling capacitor.

The display device may further comprise a fifth transistor that includes a first electrode connected to the second electrode of the first transistor, a second electrode connected to a second electrode of the first auxiliary transistor, and a gate electrode connected to the second gate power source line.

The first auxiliary transistor may include a first electrode connected to the second control node, the second electrode connected to the second electrode of the fifth transistor, and a gate electrode connected to the second electrode of the fifth transistor, and the second auxiliary transistor may include the first electrode connected to the second electrode of the fourth transistor, a second electrode connected to the output terminal, and a gate electrode connected to the first clock input terminal.

The boosting capacitor may include a first electrode connected to the first electrode of the second auxiliary transistor and a second electrode connected to the second electrode of the first auxiliary transistor.

The node controller may further comprise a fifth transistor that includes a first electrode, a second electrode connected to the second electrode of the first auxiliary transistor, and a gate electrode connected to the second gate power source line; and a third auxiliary transistor that includes a first electrode connected to the input terminal, a second electrode connected to the first electrode of the fifth transistor, and a gate electrode connected to the first clock input terminal.

The node controller may further comprise a second coupling transistor that includes a first electrode connected to the second electrode of the first transistor, a second electrode connected to the second control node, and a gate electrode connected to the second gate power source line.

The first stage may further comprise an eighth transistor that includes a first electrode connected to the first gate power source line, a second electrode connected to the first control node, and a gate electrode connected to the second electrode of the first transistor; a first capacitor that includes a first electrode connected to the first gate power source line and a second electrode connected to the first control node; and a reset transistor that includes a first electrode connected to the first gate power source line, a second electrode connected to the second electrode of the first transistor, and a gate electrode connected to a reset line.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION OF THE ILLUSTRATED EMBODIMENTS

Figure 1:
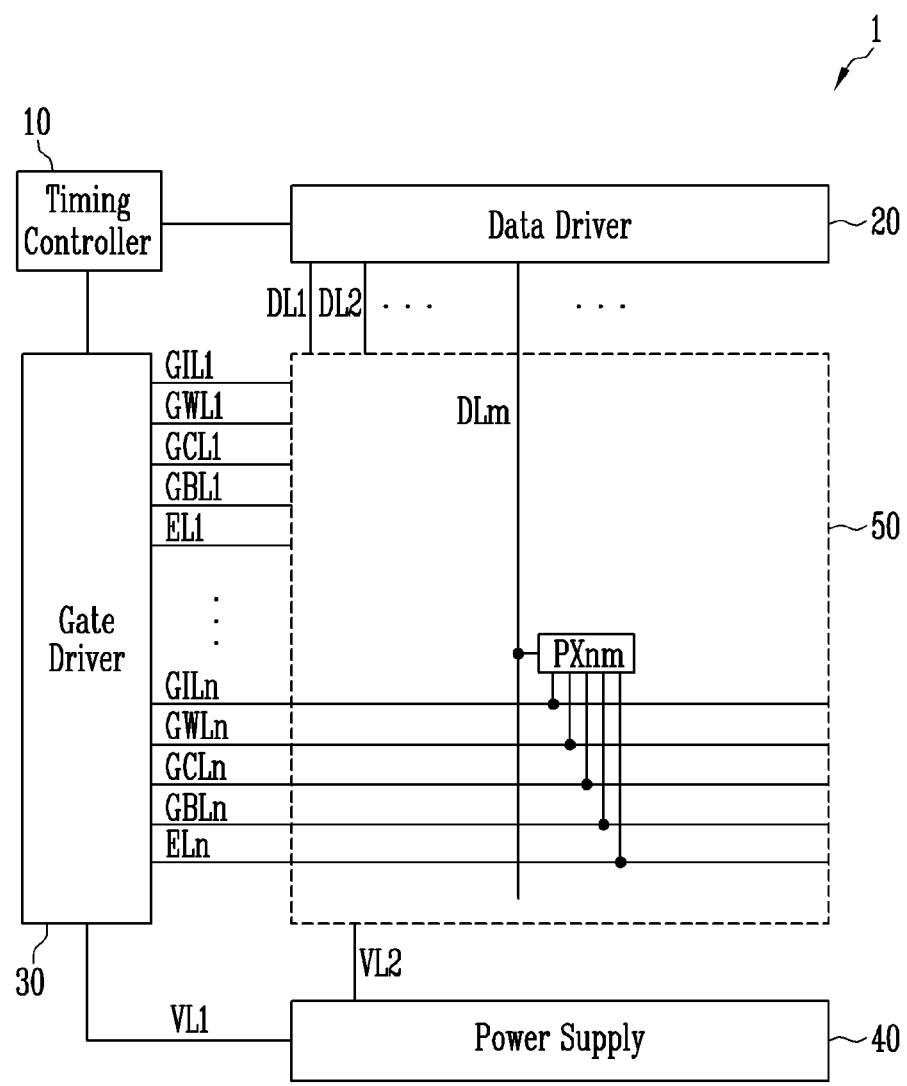
FIG. 1 is a diagram for explaining a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath"

other elements or features would then be oriented "above" the other elements or features. Thus, the term "below" can encompass both an orientation of above is and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a diagram for explaining a display device according to an embodiment that is constructed according to principles of the invention.

Referring to FIG. 1, a display device 1 according to an embodiment may include a timing controller 10, a data driver 20, a gate driver 30, a power supply 40, and a display panel 50.

The timing controller 10 may receive an external input signal from an external processor. The external input signal may include a vertical synchronization signal, a horizontal synchronization signal, a data enable signal, an RGB data signal, and the like.

The vertical synchronization signal may include a plurality of pulses, and may is indicate that a previous frame period ends and a current frame period starts based on a time point at which each pulse is generated. An interval between adjacent pulses of the vertical synchronization signal may correspond to one frame period. The horizontal synchronization signal may include a plurality of pulses, and may indicate that a previous horizontal period ends and a new horizontal period starts based on a time point at which each pulse is generated. An interval between adjacent pulses of the horizontal synchronization signal may correspond to one horizontal period. The data enable signal may have an enable level for specific horizontal periods and may have a disable level for the remaining periods. When the data enable signal is at the enable level, it may indicate that the RGB data signal is supplied in corresponding horizontal periods. The RGB data signal may be supplied in units of pixel rows in each corresponding horizontal period. The timing controller 10 may generate grayscale values based on the RGB data signal to correspond to a specification of the display device 1.

The timing controller 10 may generate control signals to be supplied to the data driver 20, the gate driver 30, and the like based on the external input signal to correspond to the specification of the display device 1.

The data driver 20 may generate data voltages to be provided to data lines DL1, DL2, and DLm using the grayscale values and the control signals received from the timing controller 10. For example, the data driver 20 may sample the grayscale values using a clock signal, and apply the data voltages corresponding to the grayscale values to the data lines DL1, DL2, and DLm in units of pixel rows (for example, pixels connected to the same gate line).

The gate driver 30 may receive a clock signal, a gate start signal, and the like from the timing controller 10, and receive a first gate power source voltage, a second gate power source voltage, and the like from the power supply 40 to generate gate signals to be provided to gate lines GIL1, GWL1, GCL1, GBL1, EL1, GILn, GWLn, GCLn, GBLn, and ELn, where n may be an integer greater than 0.

The gate driver 30 may include a plurality of sub-gate drivers. For example, the sub-gate drivers may include a write gate driver, a compensation gate driver, and an emission gate driver. Also, each of the sub-gate drivers may include a plurality of gate stages connected in the form of a shift register. For example, the gate signals may be generated by sequentially transferring a turn-on level pulse of the gate start signal supplied to a gate start line to the next gate stage. A detailed configuration of the gate driver 30 will be described later with reference to FIGS. 5 to 9.

The power supply 40 may supply the first gate power source voltage and the second gate power source voltage to the gate driver 30 through gate power source lines VL1. Also, the power supply 40 may supply an initialization power source voltage, a first power source voltage, a second power source voltage, and the like to the display panel 50 through pixel power source lines VL2.

The power supply 40 may be implemented as an independent integrated circuit, but is not limited thereto. For example, the power supply 40 may be implemented as a single integrated circuit together with the data driver 20. That is, the first gate power source voltage and the second gate power source voltage may be provided from the data driver 20 to the gate driver 30, and the initialization power source voltage, the first power source voltage, and the second power source voltage may be provided from the data driver 20 to the display panel 50.

The display panel 50 may include a plurality of pixels. For example, a pixel PXnm may be connected to a corresponding data line DLm and corresponding gate lines GILn, GWLn, GCLn, GBLn, and ELn.

Figure 2:
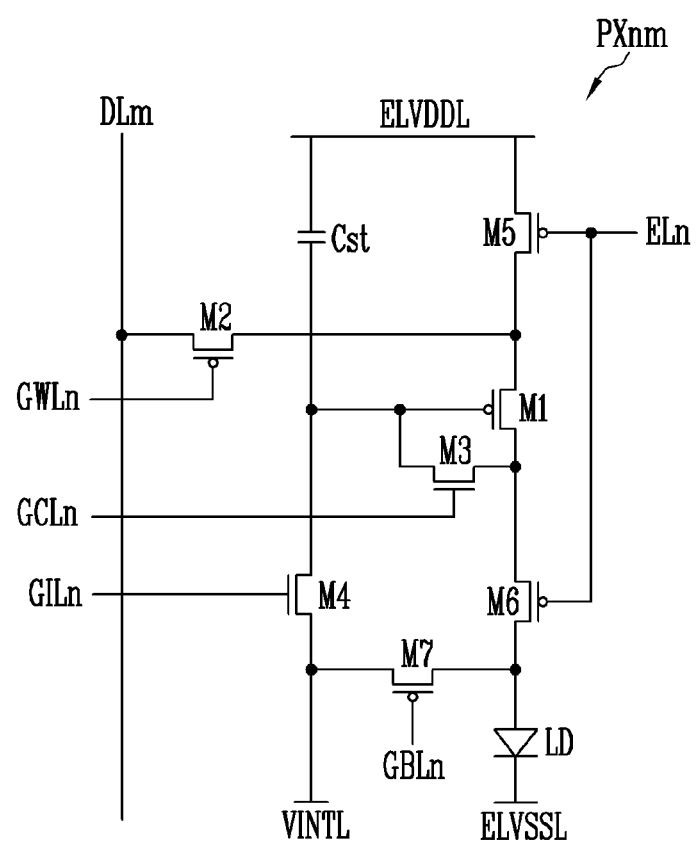
FIG. 2 is a diagram for explaining a pixel according to an embodiment.

FIG. 2 is a diagram for explaining a pixel according to an embodiment.

Referring to FIG. 2, the pixel PXnm according to an embodiment may include transistors M1, M2, M3, M4, M5, M6, and M7, a storage capacitor Cst, and a light emitting diode LD.

A first transistor M1 may be connected between a first power source line ELVDDL and the light emitting diode LD. That is, a first electrode of the first transistor M1 may be connected to a second electrode of a second transistor M2, a second electrode of the first transistor M1 may be connected to a second electrode of a third transistor M3, and a gate electrode of the first transistor M1 may be connected to a first electrode of the third transistor M3. The first transistor M1 may be referred to as a driving transistor.

The second transistor M2 may be connected between a data line DLm and the first electrode of the first transistor M1. That is, a first electrode of the second transistor M2 may be connected to the data line DLm, the second electrode of the second transistor M2 may be connected to the first electrode of the first transistor M1, and a gate electrode of the second transistor M2 may be connected to a gate line GWLn (or a write gate line). The second transistor M2 may be referred to as a gate transistor.

The third transistor M3 may be connected between the gate electrode of the first transistor M1 and the second electrode of the first transistor M1. That is, the first electrode of the third transistor M3 may be connected to the gate electrode of the first transistor M1, the second electrode of the third transistor M3 may be connected to the second electrode of the first transistor M1, and a gate electrode of the third transistor M3 may be connected to a gate line GCLn (or a compensation gate line). The third transistor M3 may be referred to as a diode-connected transistor.

A fourth transistor M4 may be connected between the gate electrode of the first transistor M1 and an initialization power source line VINTL. That is, a first electrode of the fourth transistor M4 may be connected to the gate electrode of the first transistor M1 (or a second electrode of the capacitor Cst), a second electrode of the fourth transistor M4 may be connected to the initialization power source line VINTL, and a gate electrode of the fourth transistor M4 may be connected to a gate line GILn (or an initialization gate line). The fourth transistor M4 may be referred to as a gate initialization transistor.

A fifth transistor M5 may be connected between the first power source line ELVDDL and the first electrode of the first transistor M1. That is, a first electrode of the fifth transistor M5 may be connected to the first power source line ELVDDL, a second electrode of the fifth transistor M5 may be connected to the first electrode of the first transistor M1, and a gate electrode of the fifth transistor M5 may be connected to a gate line ELn (or an emission gate line). The fifth transistor M5 may be referred to as a first emission transistor.

A sixth transistor M6 may be connected to the second electrode of the first transistor M1 and an anode electrode of the light emitting diode LD. That is, a first electrode of the sixth transistor M6 may be connected to the second electrode of the first transistor M1, a second electrode of the sixth transistor M6 may be connected to the anode electrode of the light emitting diode LD, and a gate electrode of the sixth transistor M6 may be connected to the gate line ELn (or the emission gate line). The sixth transistor M6 may be referred to as a second emission transistor.

A seventh transistor M7 may be connected to the initialization power source line VINTL and the anode electrode of the light emitting diode LD. That is, a first electrode of the seventh transistor M7 may be connected to the initialization power source line VINTL (or the second electrode of the fourth transistor M4), a second electrode of the seventh transistor M7 may be connected to the anode electrode of the light emitting diode LD, and a gate electrode of the seventh transistor M7 may be connected to a gate line GBLn (or a bypass gate line). The seventh transistor M7 may be referred to as an anode initialization transistor.

The storage capacitor Cst may have a first electrode connected to the first power source line ELVDDL and a second electrode connected to the gate electrode of the first transistor M1.

The light emitting diode LD may have the anode electrode connected to the second electrode of the sixth transistor M6 and a cathode electrode connected to a second power source line ELVSSL. A voltage applied to the second power source line ELVSSL may be set to be lower than a voltage applied to the first power source line ELVDDL.

In an embodiment, the light emitting diode LD may be an organic light emitting diode including an organic light emitting layer. In another embodiment, the light emitting diode LD may be an inorganic light emitting element formed of an inorganic material. In another embodiment, the light emitting diode LD may be a light emitting element composed of an inorganic material and an organic material in combination. The light emitting diode LD may have a form in which a plurality of inorganic light emitting elements are connected in parallel and/or in series between the second power source line ELVSSL and the sixth transistor M6.

Each of the first transistor M1, the second transistor M2, the fifth transistor M5, the sixth transistor M6, and the seventh transistor M7 may be a P-type transistor. A channel of each of the first transistor M1, the second transistor M2, the fifth transistor M5, the sixth transistor M6, and the seventh transistor M7 may be formed of polysilicon. A polysilicon transistor may be a low temperature polysilicon (LTPS) transistor. The polysilicon transistor may is have high electron mobility, and thus have fast driving characteristics.

Each of the third transistor M3 and the fourth transistor M4 may be an N-type transistor. A channel of each of the third transistor M3 and the fourth transistor M4 may be formed of an oxide semiconductor. An oxide semiconductor transistor may be manufactured by a low temperature process, and may have low charge mobility compared to the polysilicon transistor. Accordingly, the amount of leakage current generated in a turned-off state of the oxide semiconductor transistors may be smaller than that of the polysilicon transistor.

According to an embodiment, the seventh transistor M7 may be formed of an N-type oxide semiconductor transistor instead of the polysilicon transistor. In this case, one of the gate lines GCLn, GILn, and ELn may be connected to the gate electrode of the seventh transistor M7 to replace the gate line GBLn.

Figure 3:
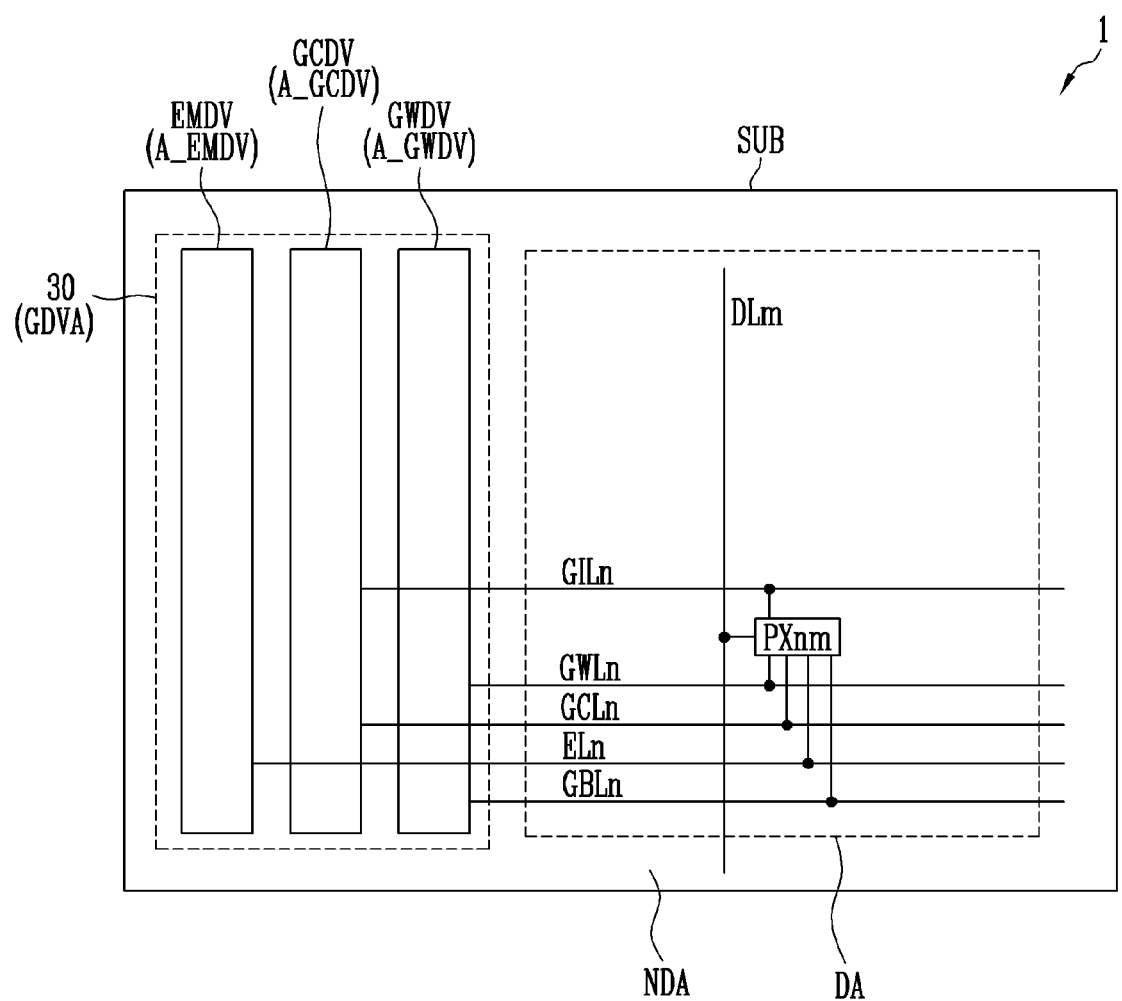
FIG. 3 is a plan view illustrating an example of the display device of FIG. 1.

FIG. 3 is a plan view illustrating an example of the display device of FIG. 1.

Referring to FIGS. 1 to 3, the display device 1 may include a substrate SUB.

The substrate SUB may include a display area DA and a non-display area NDA surrounding the display area DA. The non-display area NDA may include the gate driver 30 (or a gate circuit area GDVA).

Data lines DLm, gate lines GWLn, GCLn, GBLn, GILn, and ELn, and the pixel PXnm may be provided on the display area DA of the substrate SUB. The display area DA of the substrate SUB may correspond to the display panel 50 described with reference to FIG. 1.

The gate driver 30 may be disposed on the gate circuit area GDVA of the substrate SUB.

The gate driver 30 may include a write gate driver GWDV, a compensation gate driver GCDV, and an emission gate driver EMDV. The gate circuit area GDVA of the substrate SUB may include a write gate circuit area A_GWDV, a compensation gate circuit area A_GCDV, and an emission gate circuit area A_EMDV, which are separated from each other. The write gate driver GWDV, the compensation gate driver GCDV, and the emission gate driver EMDV may be respectively disposed or formed on the write gate circuit area A_GWDV, the compensation gate circuit area A_GCDV, and the emission gate circuit area A_EMDV. In an embodiment, the write gate driver GWDV may be closest to the display area DA. The compensation gate driver GCDV may be spaced apart from the display panel 50 than the write gate driver GWDV, and the emission gate driver EMDV may be spaced apart from the display area DA than the compensation gate driver GCDV.

The write gate driver GWDV may be in the form of a shift register and may include a plurality of write gate stages. In response to a write start signal received from the timing controller 10 (see FIG. 1), the write gate stages may sequentially generate write gate signals of a turn-on level (for example, a logic low level). The write gate signals of the turn-on level may be provided to corresponding write gate lines GWLn. According to an embodiment, the write gate signals may be used as bypass gate signals, and the write gate signals of the turn-on level may also be provided to corresponding bypass gate lines GBLn. For example, a write gate signal (that is, a subsequent write gate signal) generated later than a write gate signal applied to the write gate line GWLn may be provided to a bypass gate line GBLn as a bypass gate signal.

The compensation gate driver GCDV (or an initialization gate driver) may be in the form of a shift register and may include a plurality of compensation gate stages (or initialization gate stages).

In response to a compensation start signal (or an initialization start signal) received from the timing controller 10, the compensation gate stages may sequentially generate compensation gate signals of a turn-on level (for example, a logic high level) based on a first clock signal and a second clock signal. The compensation gate signals may be provided to corresponding compensation gate lines GCLn. According to an embodiment, the compensation gate signals may be used as initialization gate signals, and the compensation gate signals of the turn-on level may also be provided to corresponding initialization gate lines GILn. For example, a compensation gate signal (that is, a previous compensation gate signal) generated before a compensation gate signal applied to the compensation gate line GCLn may be provided to the initialization gate line GILn as an initialization gate signal.

The emission gate driver EMDV may be in the form of a shift register and may include a plurality of emission gate stages. In response to an emission start signal received from the timing controller 10 (see FIG. 1), the emission gate stages may sequentially generate emission gate signals of a turn-off level. The emission gate signals of the turn-off level (for example, a logic high level) may be provided to corresponding emission gate lines ELn.

Figure 4:
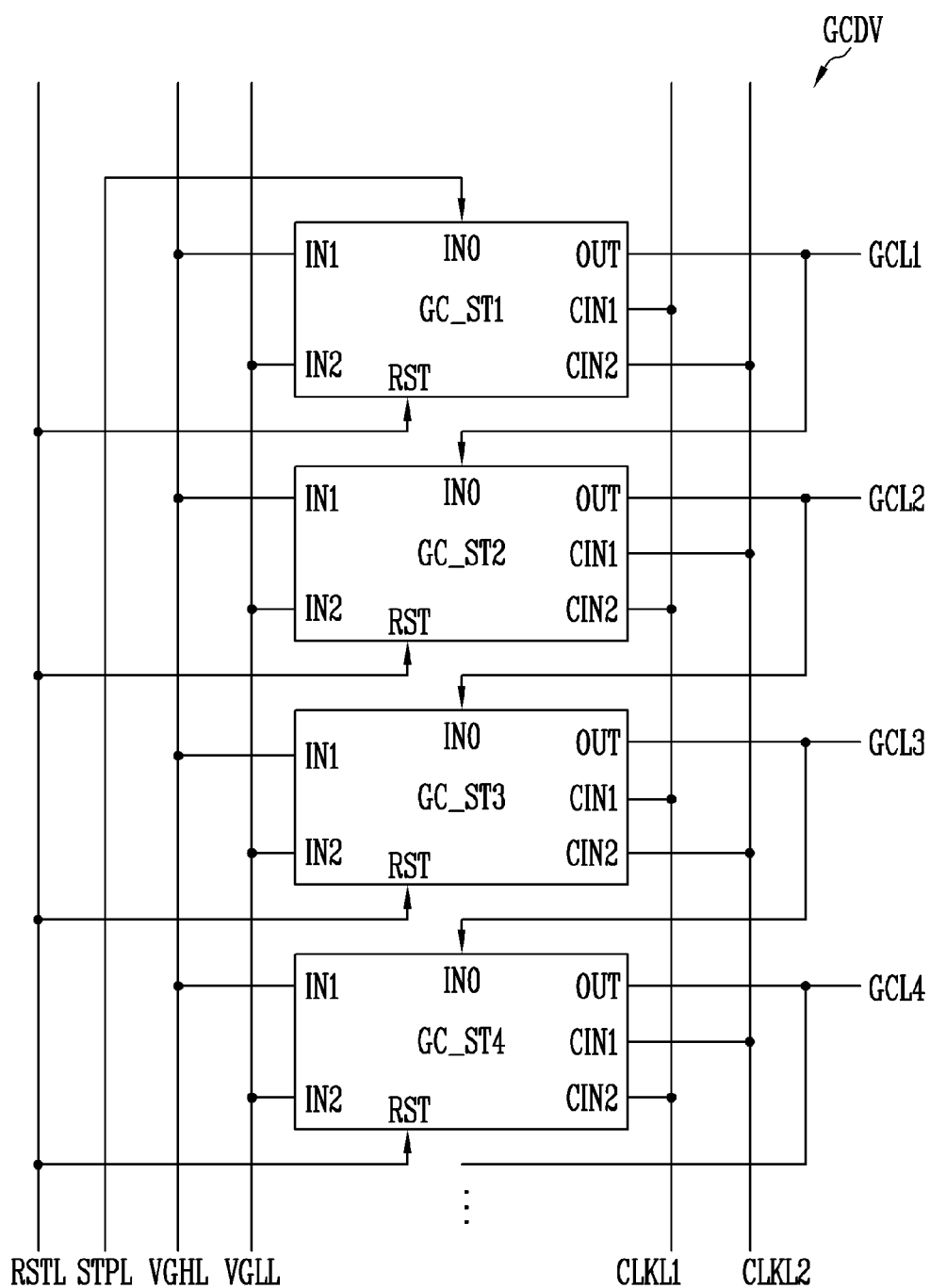
FIG. 4 is a diagram illustrating an example of a compensation gate driver included in the display device of FIG. 3.

FIG. 4 is a diagram illustrating an example of a compensation gate driver included in the display device of FIG. 3.

Referring to FIGS. 3 and 4, the compensation gate driver GCDV may include a plurality of compensation gate stages GC_ST1, GC_ST2, GC_ST3, and GC_ST4 (or stages). FIG. 4 shows only a portion of the compensation gate driver GCDV for convenience of description.

Each of the compensation gate stages GC_ST1, GC_ST2, GC_ST3, and GC_ST4 may include an input terminal IN0, a first power source input terminal IN1, a second power source input terminal IN2, a first clock input terminal CIN1, a second clock input terminal CIN2, is a reset terminal RST, and an output terminal OUT. As will be described later with reference to FIG. 5, internal circuit configurations of the compensation gate stages GC_ST1, GC_ST2, GC_ST3, and GC_ST4 may be substantially the same.

Each of the compensation gate stages GC_ST1, GC_ST2, GC_ST3, and GC_ST4 may be connected to a first gate power source line VGHL, a second gate power source line VGLL, first and second clock signal lines CLKL1 and CLKL2, and a reset signal line RSTL. Here, the second gate power source voltage may be applied to the second gate power source line VGLL, and the second gate power source voltage may have a lower voltage level (for example, a logic low level) than the first gate power source voltage (for example, a logic high level) applied to the first gate power source line VGHL.

Clock signals (or compensation clock signals) may be applied to the first and second clock signal lines CLKL1 and CLKL2 from the timing controller 10 (see FIG. 1). As will be described later with reference to FIG. 6, the second clock signal (or a second compensation clock signal) applied to the second clock signal line CLKL2 may be a signal delayed by half a cycle of the first clock signal (or a first compensation clock signal) applied to the first clock signal line CLKL1. A reset signal may be applied from the timing controller 10 (se FIG. 1) to the reset signal line RSTL when the display device 1 (se FIG. 1) is powered on and/or powered off. Also, a start signal (or the compensation start signal or a compensation start pulse) may be applied to a start signal line STPL from the timing controller 10.

For example, in odd-numbered compensation gate stages GC_ST1 and GC_ST3, the first power source input terminal IN1 may be connected to the first gate power source line VGHL, the second power source input terminal IN2 may be connected to the second gate power source line VGLL, the first clock input terminal CIN1 may be connected to the first clock signal is line CLKL1, the second clock input terminal CIN2 may be connected to the second clock signal line CLKL2, and the reset terminal RST may be connected to the reset signal line RSTL.

For example, in even-numbered compensation gate stagGC_ST2 and GC_ST4, the first power source input terminal IN1 may be connected to the first gate power source line VGHL, the second power source input terminal IN2 may be connected to the second gate power source line VGLL, the first clock input terminal CIN1 may be connected to the second clock signal line CLKL2, the second clock input terminal CIN2 may be connected to the first clock signal line CLKL1, and the reset terminal RST may be connected to the reset signal line RSTL.

Each of the compensation gate stages GC_ST1, GC_ST2, GC_ST3, and GC_ST4 may be connected to the start signal line STPL or the output terminal OUT of a previous compensation gate stage, and may generate the compensation gate signal corresponding to the start signal provided through the start signal line STPL and the previous compensation gate signal of the previous compensation gate stage.

For example, the input terminal IN0 of a first compensation gate stage GC_ST1 may be connected to the start signal line STPL. The first compensation gate stage GC_ST1 may generate a first compensation gate signal corresponding to the start signal applied to the start signal line STPL (for example, the start signal delayed by half a cycle of the clock signal). In addition, the input terminal IN0 of a second compensation gate stage GC_ST2 may be connected to the output terminal OUT of the first compensation gate stage GC_ST1 (or a first compensation gate line GCL1). The second compensation gate stage GC_ST2 may generate a second compensation gate signal corresponding to the first compensation gate signal (for example, the first compensation gate signal delayed by half a cycle of the clock signal). Similarly, the input terminal IN0 of a third compensation gate stage GC_ST3 may be connected to the output terminal OUT of the second compensation gate stage GC_ST2 (or a second compensation gate line GCL2). The input terminal IN0 of a fourth compensation gate stage GC_ST4 may be connected to the output terminal OUT of the third compensation gate stage GC_ST3 (or a third compensation gate line GCL3).

That is, the compensation gate stages GC_ST1, GC_ST2, GC_ST3, and GC_ST4 may sequentially generate compensation gate signals GCn (see FIG. 4) corresponding to the start signal. In some embodiments, each of the compensation gate stages GC_ST1, GC_ST2, GC_ST3, and GC_ST4 may output the compensation gate signal to compensation gate lines GCL1, GCL2, GCL3, and GCL4.

Figure 5:
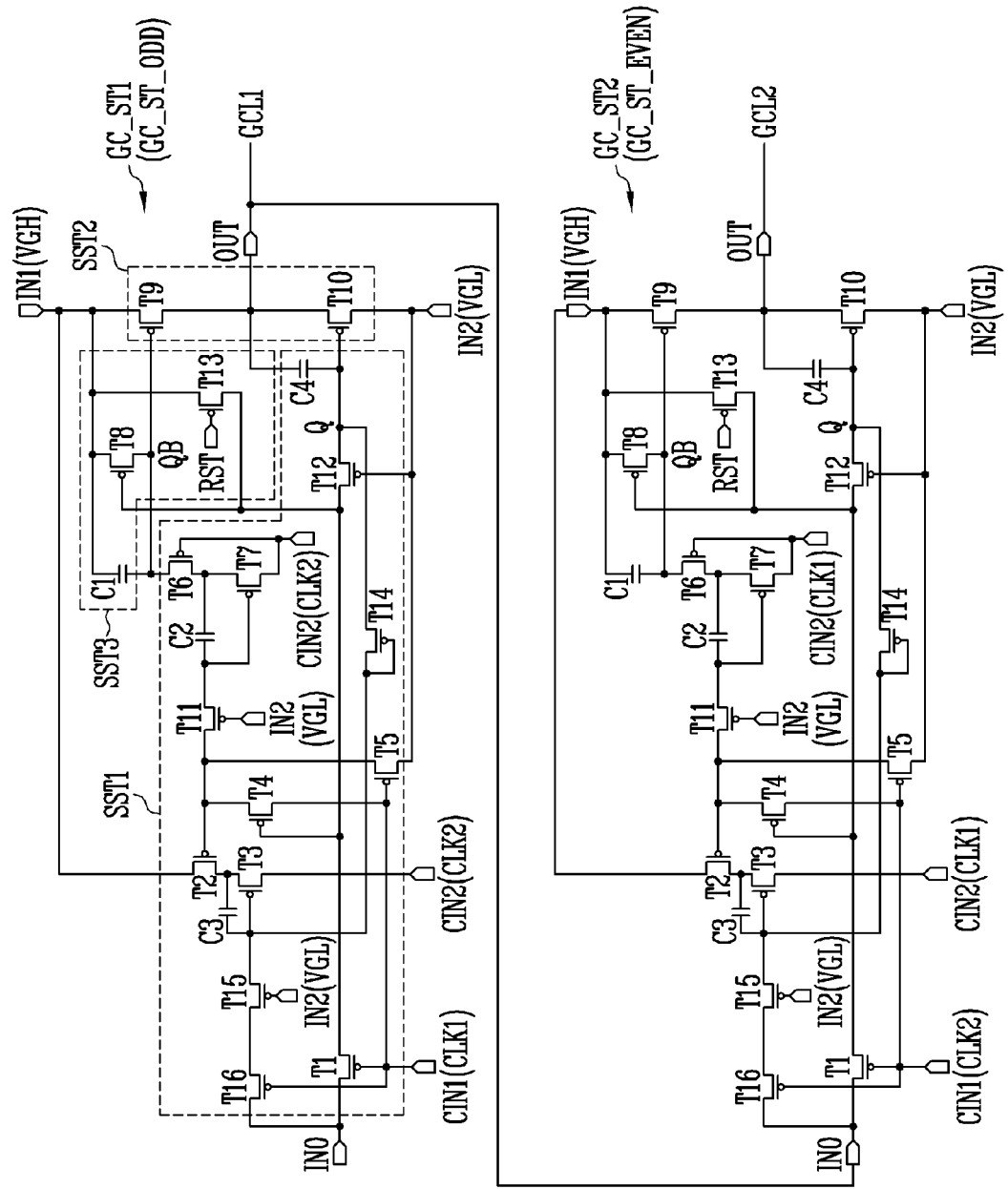
FIG. 5 is a circuit diagram illustrating an example of a first compensation gate stage and a second compensation gate stage included in the compensation gate driver of FIG. 4.

FIG. 5 is a circuit diagram illustrating an example of a first compensation gate stage and a second compensation gate stage included in the compensation gate driver of FIG. 4. Each of the odd-numbered compensation gate stages GC_ST1 and GC_ST3 described with reference to FIG. 4 may be substantially the same as the first compensation gate stage GC_ST1, and each of the even-numbered compensation gate stages GC_ST2 and GC_ST4 may be substantially the same as the second compensation gate stage GC_ST2. Accordingly, the first compensation gate stage GC_ST1 and the second compensation gate stage GC_ST2 will be described instead of the compensation gate stages GC_ST1, GC_ST2, GC_ST3, and GC_ST4.

Referring to FIGS. 4 and 5, in the first compensation gate stage GC_ST1, the first power source input terminal IN1 may be connected to the first gate power source line VGHL, the second power source input terminal IN2 may be connected to the second gate power source line VGLL, the first clock input terminal CIN1 may be connected to the first clock signal line CLKL1, the second clock input terminal CIN2 may be connected to the second clock signal line CLKL2, and the reset terminal RST may be connected to the reset signal line RSTL. A first gate is power source voltage VGH may be applied to the first gate power source line VGHL, a second gate power source voltage VGL may be applied to the second gate power source line VGLL, a first clock signal CLK1 may be applied to the first clock signal line CLKL1 (and the first clock input terminal CIN1), and a second clock signal CLK2 may be applied to the second clock signal line CLKL2 (and the second clock input terminal CIN2). The input terminal IN0 may be connected to the start signal line STPL.

The first compensation gate stage GC_ST1 (or the odd-numbered compensation gate stage GC_ST_ODD) may include a node controller SST1, an output unit SST2 (or a buffer unit), and a node holding unit SST3.

First, the output unit SST2 may be connected to the first power source input terminal IN1 and the second power source input terminal IN2. The output unit SST2 may output the first gate power source voltage VGH as the first compensation gate signal to the output terminal OUT based on a voltage of a second control node Q and a voltage of a first control node QB.

The output unit SST2 may include a ninth transistor T9 (or a pull-up transistor) and a tenth transistor T10 (or a pull-down transistor).

The ninth transistor T9 may include a first electrode connected to the first power source input terminal IN1, a second electrode connected to the output terminal OUT, and a gate electrode connected to the first control node QB.

The tenth transistor T10 may include a first electrode connected to the output terminal OUT, a second electrode connected to the second power source input terminal IN2, and a gate electrode connected to the second control node Q.

The node controller SST1 may be connected to the input terminal IN0, the first is power source input terminal IN1, the second power source input terminal IN2, the first clock input terminal CIN1, and the second clock input terminal CIN2. The node controller SST1 may control the voltage of the first control node QB and the voltage of the second control node Q using the start signal (or the previous compensation gate signal) provided through the input terminal IN0 and the first gate power source voltage VGH provided through the first power source input terminal IN1.

The node controller SST1 may include first, second, third, fourth, fifth, sixth, seventh, eleventh, twelfth, fourteenth, fifteenth, and sixteenth transistors T1, T2, T3, T4, T5, T6, T7, T11, T12, T14, T15, and T16, a second capacitor C2 (or a first coupling capacitor), a third capacitor C3 (or a second coupling capacitor), and a fourth capacitor C4 (or a boosting capacitor).

The first transistor T1 may include a first electrode connected to the input terminal IN0, a second electrode connected to a first electrode of the twelfth transistor T12, and a gate electrode connected to the first clock input terminal CIN1.

The second transistor T2 may include a first electrode connected to the first power source input terminal IN1, a second electrode connected to a first electrode of the third transistor T3, and a gate electrode connected to a first electrode of the eleventh transistor T11.

The third transistor T3 may include a first electrode connected to the second electrode of the second transistor T2, a second electrode connected to the second clock input terminal CIN2, and a gate electrode connected to the second control node Q via the fourteenth transistor T14.

The third capacitor C3 may be connected in series with the fourteenth transistor T14 between the second electrode of the second transistor T2 and the second control node Q, and may include a first electrode connected to the second electrode of the second transistor T2 and a second electrode connected to the second control node Q.

The fourth transistor T4 may include a first electrode connected to the gate electrode of the second transistor T2, a second electrode connected to the first clock input terminal CIN1, and a gate electrode connected to the second electrode of the first transistor T1.

The fifth transistor T5 may include a first electrode connected to the gate electrode of the second transistor T2, a second electrode connected to the second power source input terminal IN2, and a gate electrode connected to the first clock input terminal CIN1.

The sixth transistor T6 may include a first electrode connected to the first control node QB, a second electrode connected to a first electrode of the seventh transistor T7, and a gate connected to the second clock input terminal CIN2.

The seventh transistor T7 may include the first electrode connected to the second electrode of the sixth transistor T6, a second electrode connected to the second clock input terminal CIN2, and a gate electrode connected to a second electrode of the eleventh transistor T11.

The second capacitor C2 may be formed between the second electrode of the eleventh transistor T11 and the second electrode of the sixth transistor T6, and may include a first electrode connected to the second electrode of the eleventh transistor T11 and a second electrode connected to the second electrode of the sixth transistor T6.

The eleventh transistor T11 (or a first coupling transistor) may include a first electrode connected to the gate electrode of the second transistor T2, a second electrode connected to the first electrode of the second capacitor C2, and a gate electrode connected to the second power source input terminal IN2.

The twelfth transistor T12 (or a second coupling transistor) may include a first electrode connected to the second electrode of the first transistor T1, a second electrode connected to the second control node Q, and a gate electrode connected to the second power source input terminal IN2.

The fourteenth transistor T14 (or a first auxiliary transistor) may include a first electrode connected to the gate electrode of the third transistor T3, a second electrode connected to the second control node Q, and a gate electrode connected to the gate electrode of the third transistor T3. That is, the fourteenth transistor T14 may be connected in the form of a diode between the gate electrode of the third transistor T3 and the second control node Q.

The fifteenth transistor T15 (or a second auxiliary transistor) may include a first electrode connected to a second electrode of the sixteenth transistor T16, a second electrode connected to the gate electrode of the third transistor T3, and a gate electrode connected to the second power source input terminal IN2. The fifteenth transistor T15 may reduce or divide a bias voltage applied to the sixteenth transistor T16 between the input terminal IN0 and the gate electrode of the third transistor T3.

The sixteenth transistor T16 (or a third auxiliary transistor) may include a first electrode connected to the input terminal IN0, the second electrode connected to the first electrode of the fifteenth transistor T15, and a gate electrode connected to the first clock input terminal CIN1.

In response to the first clock signal CLK1 provided through the first clock input terminal CIN1, the sixteenth transistor T16 may initialize the gate electrode of the third transistor T3 using the start signal (or the previous compensation gate signal) provided to the input terminal IN0. This is because the gate electrode of the third transistor T3 is not initialized by the second control node Q as the fourteenth transistor T14 is added.

The fourth capacitor C4 may be formed between the output terminal OUT and the second control node Q, and may include a first electrode connected to the second electrode of the ninth transistor T9 and a second electrode connected to the second control node Q. The fourth capacitor C4 may charge a voltage when the tenth transistor T10 is turned on or turned off.

The node holding unit SST3 may constantly maintain the voltage of the first control node QB in response to the voltage of the second control node Q. The node holding unit SST3 may include a first capacitor C1, an eighth transistor T8, and a thirteenth transistor T13.

The first capacitor C1 may be formed between the first power source input terminal IN1 and the first control node QB, and may include a first electrode connected to the first power source input terminal IN1 and a second electrode connected to the first control node QB. The first capacitor C1 may stabilize the voltage of the first control node QB.

The eighth transistor T8 may include a first electrode connected to the first power source input terminal IN1, a second electrode connected to the first control node QB, and a gate electrode connected to the second electrode of the first transistor T1. The eighth transistor T8 may constantly maintain the voltage of the first control node QB in response to a voltage of the second electrode of the first transistor T1 (that is, the voltage of the second control node Q). For example, when the voltage of the second control node Q has a logic low level, the eighth transistor T8 may maintain the voltage of the first control node QB at a logic high level using the first gate power source voltage VGH.

The thirteenth transistor T13 (or a reset transistor) may include a first electrode connected to the first power source input terminal IN1, a second electrode connected to the second electrode of the first transistor T1, and a gate electrode connected to the reset terminal RST. When the display device 1 (see FIG. 1) is turned on or turned off, a reset operation may be performed so that the reset signal of a logic low level is applied to the reset terminal RST, the thirteenth transistor T13 is turned on in response to the reset signal of the logic low level, and the voltage of the second electrode of the first transistor T1 (and the second control node Q) has the first gate power source voltage VGH.

The first to sixteenth transistors T1 to T16 may be P-type transistors. Although the first to sixteenth transistors T1 to T16 are shown as single gate transistors in FIG. 5, the present invention is not limited thereto. For example, in order to improve reliability, at least one of the first to sixteenth transistors T1 to T16 may be implemented as a dual gate transistor (that is, a dual gate transistor composed of two transistors connected in series with each other and whose gate electrodes are connected to each other).

The second compensation gate stage GC_ST2 (or the even-numbered compensation gate stage GC_ST EVEN) may be substantially the same as or similar to the first compensation gate stage GC_ST1. Therefore, duplicate descriptions will be omitted for ease in explanation of this embodiment.

In the second compensation gate stage GC_ST2, the first power source input terminal IN1 may be connected to the first gate power source line VGHL, the second power source input terminal IN2 may be connected to the second gate power source line VGLL, the first clock input terminal CIN1 may be connected to the second clock signal line CLKL2, the second clock input terminal CIN2 may be connected to the first clock signal line CLKL1, and the reset terminal RST may be connected to the reset signal line RSTL.

Reference may also be made to FIG. 5 to describe operations of the first compensation gate stage GC_ST1 and the second compensation gate stage GC_ST2.

Figure 6:
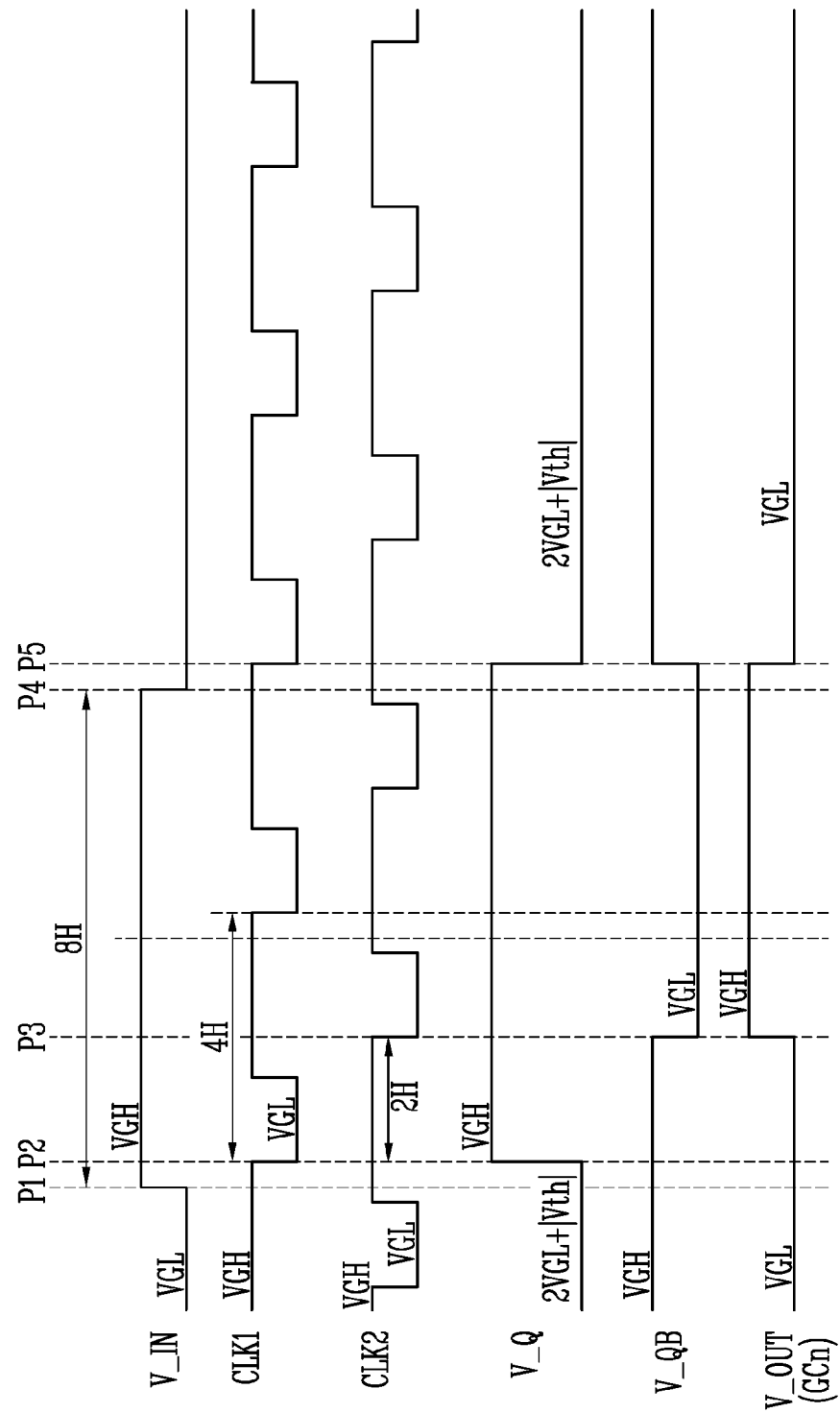
FIG. 6 is a waveform diagram illustrating an example of signals measured in the first compensation gate stage of FIG. 5.

FIG. 6 is a waveform diagram illustrating an example of signals measured in the first compensation gate stage of FIG. 5. Operations of the first compensation gate stage GC_ST1 and the second compensation gate stage GC_ST2 may be substantially the same as or similar to each other. Therefore, an operation of the first compensation gate stage GC_ST1 will be described as an example instead of the first compensation gate stage GC_ST1 and the second compensation gate stage GC_ST2.

Referring to FIGS. 5 and 6, the first clock signal CLK1 applied to the first clock input terminal CIN1 may have a first logic low level and a logic high level with a cycle of 4 horizontal periods 4H. Here, the first logic low level may correspond to a gate-on voltage level that turns on a P-type transistor, and may be the same as a voltage level of the second gate power source voltage VGL. The logic high level may correspond to a gate-off voltage level that turns off the P-type transistor, and may be the same as a voltage level of the first gate power source voltage VGH.

The second clock signal CLK2 applied to the second clock input terminal CIN2 may have a waveform in which the first clock signal CLK1 is delayed by half a cycle (that is, by 2 horizontal periods 2H).

At a first time point P1, an input voltage V_IN (for example, the start signal) of the input terminal IN0 may change from the first logic low level to the logic high level. For example, the input voltage V_IN may be maintained at the logic high level for 8 horizontal periods 8H.

At the first time point P1, a second node voltage V_Q of the second control node Q may have a second logic low level, a first node voltage V_QB of the first control node QB may have a logic high level, and an output voltage V_OUT of the output terminal OUT (that is, the first compensation gate signal) may have the first logic low level. Here, the second logic low level may have a lower voltage level than the first logic low level. For example, the second logic low level may have a lower voltage level than the first logic low level by the sum of the second gate power source voltage VGL and a threshold voltage Vth of a transistor (that is, 2VGL+|Vth|).

At a second time point P2, the first clock signal CLK1 may transition from the logic high level to the first logic low level.

In this case, in response to the first clock signal CLK1 of the first logic low level, the first transistor T1 may be turned on, and the input voltage V_IN of the logic high level may be applied to the first electrode of the twelfth transistor T12. Since the twelfth transistor T12 is turned on by the second gate power source voltage VGL, the input voltage V_IN of the logic high level may be applied to the second control node Q through the twelfth transistor T12. That is, the second node voltage V_Q may be changed to have the logic high level.

In addition, in response to the first clock signal CLK1 of the first logic low level, the fifth transistor T5 may be turned on, and the second gate power source voltage VGL may be applied to the first electrode of the eleventh transistor T11. Since the eleventh transistor T11 is turned on by the second gate power source voltage VGL, the second gate power source voltage VGL may be applied to the first electrode of the second capacitor C2. The seventh transistor T7 may be turned on in response to the second gate power source voltage VGL (that is, the second gate power source voltage VGL applied to the first electrode of the second capacitor C2), and the second clock signal CLK2 of the logic high level may be applied to the second electrode of the second capacitor C2. Accordingly, a voltage corresponding to a difference between the logic high level and the first logic low level may be charged in the second capacitor C2.

The second transistor T2 may be turned on in response to the second gate power source voltage VGL, and the first gate power source voltage VGH may be applied to the second electrode of the third capacitor C3. Since the first electrode of the third capacitor C3 is connected to the second electrode of the fifteenth transistor T15 and the second electrode of the fifteenth transistor T15 has the logic high level, the third capacitor C3 may be discharged (or initialized). In this case, since the sixteenth transistor T16 is turned on by the first clock signal CLK1 of the logic low level and the fifteenth transistor T15 is turned on by the second gate power source voltage VGL, the input voltage V_IN of the logic high level may be applied to the second electrode of the third capacitor C3.

At a third time point P3, the second clock signal CLK2 may transition from the logic high level to the first logic low level.

In this case, the sixth transistor T6 may be turned on in response to the second clock signal CLK2 of the first logic low level, and the second clock signal CLK2 of the first logic low level may be applied to the first control node QB through the seventh transistor T7 turned on by the second capacitor C2 and the sixth transistor T6 turned on. That is, the first node voltage V_QB may be changed to have the first logic low level.

The ninth transistor T9 may be turned on in response to the first node voltage V_QB of the first logic low level, and the first gate power source voltage VGH may be applied to the output terminal OUT through the first power source input terminal IN1 and the ninth transistor T9. That is, the output voltage V_OUT may be changed to have the logic high level.

As shown in FIG. 5, the output voltage V_OUT (that is, the first compensation gate signal) of the first compensation gate stage GC_ST1 may be applied to the first compensation gate line GCL1.

Thereafter, even if the first control node QB is in a floating state due to changes in the first clock signal CLK1 and the second clock signal CLK2, the first node voltage V_QB may be maintained at the first logic low level by the first capacitor C1, and the output voltage V_OUT may be maintained at the logic high level.

At a fourth time point P4, the input voltage V_IN may change from the logic high level to the first logic low level.

At a fifth time point P5, the first clock signal CLK1 may transition from the logic high level to the first logic low level.

In this case, the first transistor T1 may be turned on in response to the first clock signal CLK1 of the first logic low level, and the input voltage V_IN of the first logic low level may be applied to the first electrode of the twelfth transistor T12. Since the twelfth transistor T12 is turned on by the second gate power source voltage VGL, the input voltage V_IN of the first logic low level may be applied to the second control node Q through the twelfth transistor T12, and the second node voltage V_Q may be changed to a third logic low level (that is, VGL+|Vth|) by a threshold voltage of the twelfth transistor T12.

Thereafter, the fourth capacitor C4 may be charged above a threshold voltage Vth of the tenth transistor T10, and the tenth transistor T10 may be turned on by the first clock signal CLK1 of the first logic low level. Therefore, when the second gate power source voltage VGL is received at the first electrode of the fourth capacitor C4, the second control node Q may be bootstrapped. That is, the second control node Q connected to the gate electrode of the tenth transistor T10 may be boosted with a boosting voltage (that is, the second logic low level (2VGL+|Vth|) at the third logic low level (that is, VGL+|Vth|). The output unit SST2 may stably output the second gate power source voltage VGL as the first compensation gate signal of the logic low level while the second logic low level (2VGL+|Vth|) is applied to the second control node Q.

The fourth transistor T4 may be turned on by the input voltage V_IN of the first logic low level provided through the first transistor T1. In addition, the fifth transistor T5 may be turned on in response to the first clock signal CLK1 of the first logic low level, and the second gate power source voltage VGL (and the first clock signal CLK1) may be applied to the gate electrode of the second transistor T2. The second transistor T2 may be turned on in response to the second gate power source voltage VGL, and the first gate power source voltage VGH may be applied to the second electrode of the third capacitor C3. The eighth transistor T8 may be turned on by the input voltage V_IN of the first logic low level, and the first gate power source voltage VGH may be applied to the first control node QB. That is, the first node voltage V_QB may be changed to have the logic high level.

Furthermore, since the fourteenth transistor T14 is connected in the form of a diode when it is turned on, the voltage of the second control node Q may be maintained constantly regardless of a change in a voltage of the gate electrode of the third transistor T3. For this reason, the output voltage V_OUT (or the first compensation gate signal) does not have a change in voltage after the fifth time point P5, and a malfunction of the pixel due to the output voltage V_OUT can be prevented.

Hereinafter, other embodiments will be described. In the following embodiments, descriptions of the same components as those of the previously described embodiments will be omitted or simplified, and differences will be mainly described.

Figure 7:
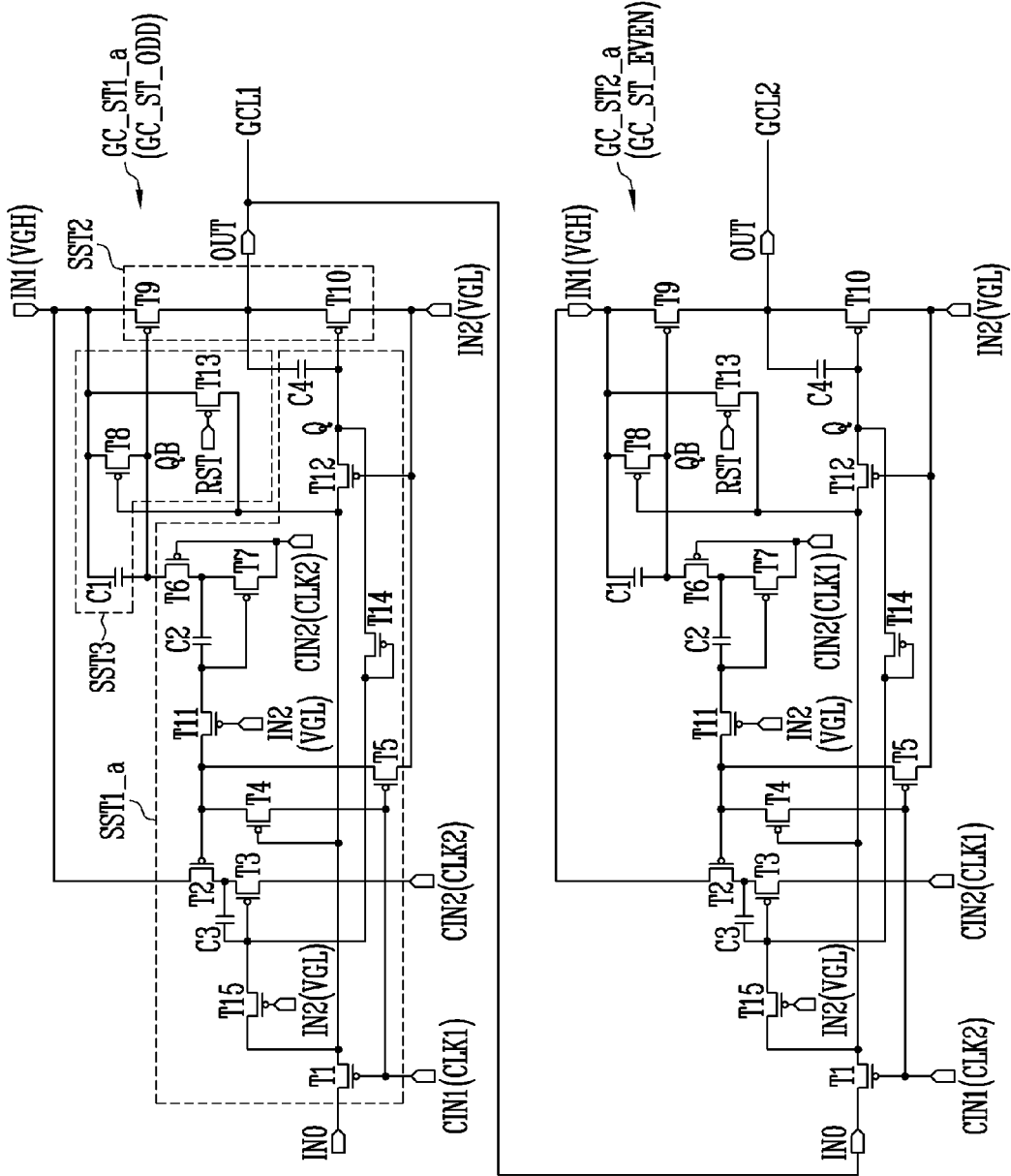
FIG. 7 is a circuit diagram illustrating an example of the first compensation gate stage and the second compensation gate stage included in the compensation gate driver of FIG. 4.

FIG. 7 is a circuit diagram illustrating an example of the first compensation gate stage and the second compensation gate stage included in the compensation gate driver of FIG. 4.

Referring to FIGS. 5 to 7, the embodiment shown in FIG. 7 may be different from the embodiment shown in FIG. 5 in that the sixteenth transistor T16 is not included in a node controller SST1_a. Each of the odd-numbered compensation gate stages GC_ST1 and GC_ST3 described with reference to FIG. 4 may be substantially the same as a first compensation gate stage GC_ST1_a, and each of the even-numbered compensation gate stages GC_ST2 and GC_ST4 may be substantially the same as a second compensation gate stage GC_ST2_a.

Specifically, a fifteenth transistor T15 of the node controller SST1_a may include a first electrode connected to the second electrode of the first transistor T1, a second electrode connected to the gate electrode of the third transistor T3, and a gate electrode connected to the second power source input terminal IN2. The fifteenth transistor T15 may initialize the gate electrode of the third transistor T3 using the start signal (or the previous compensation gate signal) provided to the input terminal IN0 when the first transistor T1 is turned on in response to the first clock signal CLK1 provided through the first clock input terminal CIN1. That is, the fifteenth transistor T15 shown in FIG. 7 may perform substantially the same function as the sixteenth transistor T16 shown in FIG. 5.

As described above, the embodiment shown in FIG. 7 may not include the sixteenth transistor T16 while performing substantially the same function as the embodiment shown in FIG. 5. Therefore, an effect of integrating the compensation gate circuit area A_GCDV shown in FIG. 3 into a smaller space can be expected.

Figure 8:
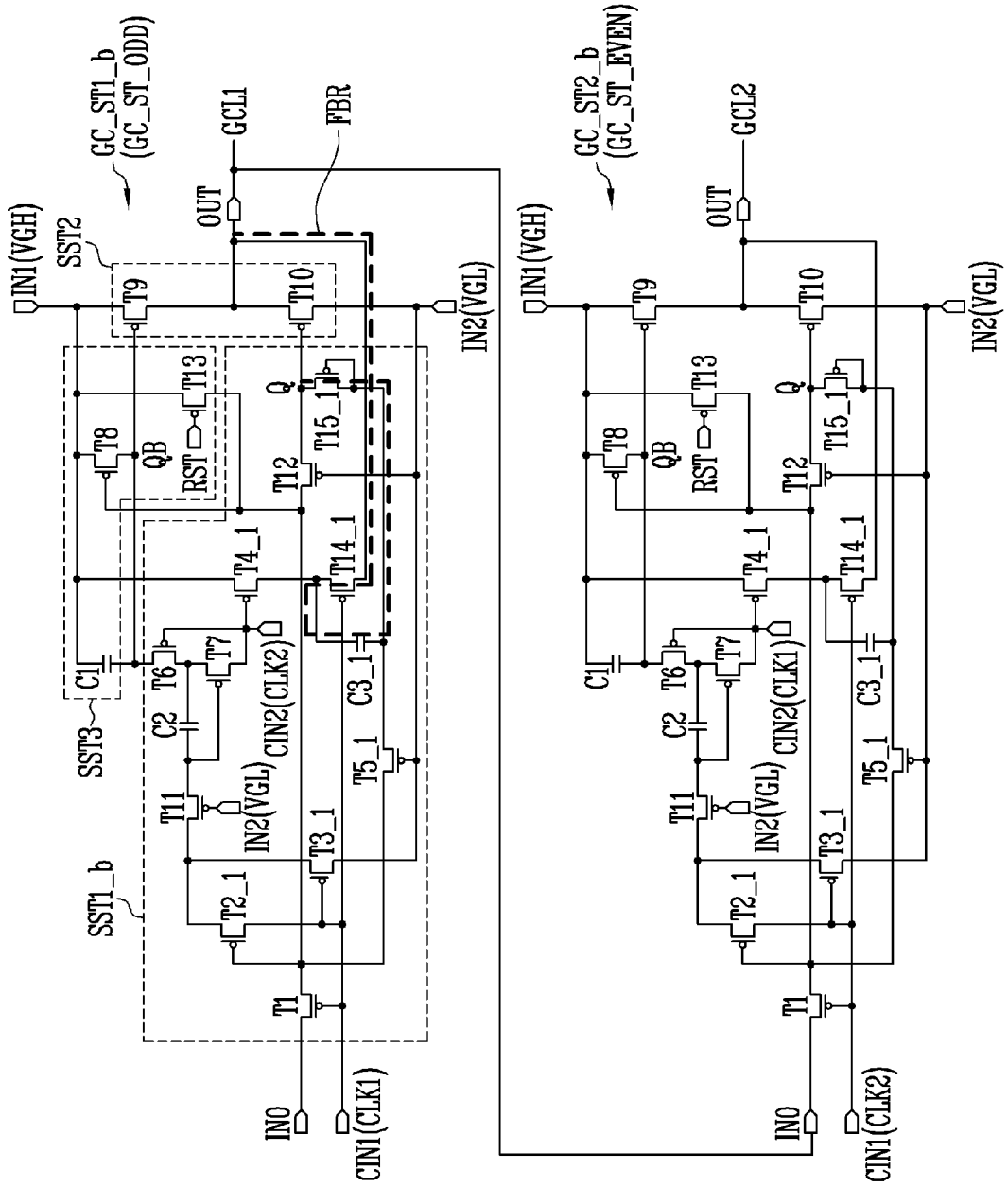
FIG. 8 is a circuit diagram illustrating an example of the first compensation gate stage and the second compensation gate stage included in the compensation gate driver of FIG. 4.

FIG. 8 is a circuit diagram illustrating an example of the first compensation gate stage and the second compensation gate stage included in the compensation gate driver of FIG. 4. Each of the odd-numbered compensation gate stages GC_ST1 and GC_ST3 described with is reference to FIG. 4 may be substantially the same as a first compensation gate stage GC_ST1_b, and each of the even-numbered compensation gate stages GC_ST2 and GC_ST4 may be substantially the same as a second compensation gate stage GC_ST2_b. Therefore, the first compensation gate stage GC_ST1_b and the second compensation gate stage GC_ST2_b will be described instead of the compensation gate stages GC_ST1, GC_ST2, GC_ST3, and GC_ST4.

In the embodiment shown in FIG. 5, the node controller SST1 may include the fourth capacitor C4 directly connected between the second control node Q and the output terminal OUT. However, the embodiment shown in FIG. 8 is different in that a node controller SST1_b may include a (3_1)th capacitor C3_1 (or a boosting capacitor) indirectly connected between a second control node Q and an output terminal OUT via a (14_1)th transistor T14_1 (or a second' auxiliary transistor) and a (15_1)th transistor T15_1 (or a first' auxiliary transistor).

The node controller SST1_b according to an embodiment may include a feedback path FBR between the output terminal OUT and the second control node Q. The (15_1)th transistor T15_1 (or the first' auxiliary transistor) connected in the form of a diode between an input terminal IN0 and the second control node Q, the (3_1)th capacitor C3_1 (or the boosting capacitor) connected between the second control node Q and the output terminal OUT, and the (14_1)th transistor T14_1 (or the second' auxiliary transistor) connected between the output terminal OUT and the (3_1)th capacitor C3_1 and controlling opening and closing of the feedback path FBR may be included on the feedback path FBR. That is, the (3_1)th third capacitor C3_1 shown in FIG. 8 may perform substantially the same function as the fourth capacitor C4 shown in FIG. 5.

Hereinafter, since an output unit SST2 and a node holding unit SST3 of the embodiment shown in FIG. 8 may be the same as those of the embodiment shown in FIG. 5, is duplicate descriptions will be omitted for ease in explanation of this embodiment, and the node controller SST1_b having a different configuration will be mainly described in detail.

Specifically, the node controller SST1_b may be connected to the input terminal IN0, a first power source input terminal IN1, a second power source input terminal IN2, a first clock input terminal CIN1, and a second clock input terminal CIN2. The node controller SST1_b may control a voltage of a first control node QB and a voltage of the second control node Q using a start signal (or a previous compensation gate signal) provided through the input terminal IN0 and a first gate power source voltage VGH provided through the first power source input terminal IN1.

The node controller SST1_b may include first, (2_1)th, (3_1)th, (4_1)th, (5_1)th, sixth, seventh, eleventh, twelfth, (14_1)th, and (15_1)th transistors T1, T2_1, T3_1, T4_1, T5_1, T6, T7, T11, T12, T14_1, and T15_1, a second capacitor C2, and a (3_1)th capacitor C3_1.

The first transistor T1 may include a first electrode connected to the input terminal IN0, a second electrode connected to a first electrode of the twelfth transistor T12, and a gate electrode connected to the first clock input terminal CIN1.

The (2_1)th transistor T2_1 may include a first electrode connected to a first electrode of the eleventh transistor T11, a second electrode connected to a gate electrode of the (3_1)th transistor T3_1, and a gate electrode connected to the second electrode of the first transistor T1.

The (3_1)th transistor T3_1 may include a first electrode connected to the first electrode of the eleventh transistor T11, a second electrode connected to a gate electrode of the (5_1)th transistor T5_1, and a gate electrode connected to the second electrode of the (2_1)th transistor T2_1.

The (4_1)th transistor T4_1 may include a first electrode connected to the first power source input terminal IN1, a second electrode connected to a first electrode of the (14_1)th transistor T14_1, and a gate electrode connected to the second clock input terminal CIN2.

The (5_1)th transistor T5_1 may include a first electrode connected to the gate electrode of the (2_1)th transistor T2_1, a second electrode connected to a second electrode of the (3_1)th capacitor C3_1, and a gate electrode connected to the second power source input terminal IN2.

The sixth transistor T6 may include a first electrode connected to the first control node QB, a second electrode connected to a first electrode of the seventh transistor T7, and a gate electrode connected to the second clock input terminal CIN2.

The seventh transistor T7 may include a first electrode connected to a second electrode of the sixth transistor T6, a second electrode connected to the second clock input terminal CIN2, and a gate electrode connected to a second electrode of the eleventh transistor T11.

The second capacitor C2 may be formed between the second electrode of the eleventh transistor T11 and the second electrode of the sixth transistor T6, and may include a first electrode connected to the second electrode of the eleventh transistor T11 and a second electrode connected to the second electrode of the sixth transistor T6.

The eleventh transistor T11 includes the first electrode connected to the first electrode of the (2_1)th transistor T2_1, the second electrode connected to the first electrode of the second capacitor C2, and a gate electrode connected to the second power source input terminal IN2.

The twelfth transistor T12 may include the first electrode connected to the second electrode of the first transistor T1, a second electrode connected to the second control node Q, and a gate electrode connected to the second power source input terminal IN2.

The (14_1)th transistor T14_1 (or a second' auxiliary transistor) may include a first electrode connected to the second electrode of the (4_1)th transistor T4_1, a second electrode connected to the output terminal OUT, and a gate electrode connected to the first clock input terminal CIN1.

The (15_1)th transistor T15_1 (or a first' auxiliary transistor) may include a first electrode connected to the second control node Q, a second electrode connected to the second electrode of the (5_1)th transistor T5_1, and a gate electrode connected to the second electrode of the (5_1)th transistor T5_1.

The (3_1)th capacitor C3_1 (or a boosting capacitor) may be formed between the second electrode of the (5_1)th transistor T5_1 and the first electrode of the (14_1)th transistor T14_1, and may include a first electrode connected to the first electrode of the (14_1)th transistor T14_1 and a second electrode connected to the second electrode of the (5_1)th transistor T5_1. The (3_1)th capacitor C3_1 may indirectly connect the second control node Q and the output terminal OUT via the (14_1)th transistor T14_1 and the (15_1)th transistor T15_1 that are turned on at a fifth time point P5 (see FIG. 6) to be described later. For this reason, the (3_1)th capacitor C3_1 may charge a voltage when the tenth transistor T10 is turned on or turned off.

Hereinafter, operations of the first compensation gate stage GC_ST1_*b* and the second compensation gate stage GC_ST2_B_*b* will be described with reference to FIGS. 6 and 8. The operations of the first compensation gate stage GC_ST1_*b* and the second compensation gate stage GC_ST2_*b* may be substantially the same as or similar to each other. Therefore, the operation of the first compensation gate stage GC_ST1_*b* will be described instead of the first is compensation gate stage GC_ST1_*b* and the second compensation gate stage GC_ST2_*b*.

At a first time point P1, an input voltage V_IN (for example, the start signal) of the input terminal IN0 may change from a first logic low level to a logic high level. For example, the input voltage V_IN may be maintained at the logic high level for 8 horizontal periods 8H.

At the first time point P1, a second node voltage V_Q of the second control node Q may have a second logic low level, a first node voltage V_QB of the first control node QB may have the logic high level, and an output voltage V_OUT of the output terminal OUT (that is, a first compensation gate signal) may have the first logic low level. Here, the second logic low level may have a lower voltage level than the first logic low level. For example, the second logic low level may have a lower voltage level than the first logic low level by the sum of a second gate power source voltage VGL and a threshold voltage Vth of a transistor (that is, 2VGL+|Vth|).

At a second time point P2, a first clock signal CLK1 may transition from the logic high level to the first logic low level.

In this case, the first transistor T1 may be turned on in response to the first clock signal CLK1 of the first logic low level, and the input voltage V_IN of the logic high level may be applied to the first electrode of the twelfth transistor T12. Since the twelfth transistor T12 is turned on by the second gate power source voltage VGL, the input voltage V_IN of the logic high level may be applied to the second control node Q through the twelfth transistor T12. That is, the second node voltage V_Q may be changed to have the logic high level.

In addition, the (3_1)th transistor T3_1 may be turned on in response to the first clock signal CLK1 of the first logic low level, and the second gate power source voltage VGL may be applied to the first electrode of the eleventh transistor T11. Since the eleventh transistor is T11 is turned on by the second gate power source voltage VGL, the second gate power source voltage VGL may be applied to the first electrode of the second capacitor C2. The seventh transistor T7 may be turned on in response to the second gate power source voltage VGL (that is, the second gate power source voltage VGL applied to the first electrode of the second capacitor C2), and a second clock signal CLK2 of the logic high level may be applied to the second electrode of the capacitor C2. Accordingly, a voltage corresponding to a difference between the logic high level and the first logic low level may be charged in the second capacitor C2.

At a third time point P3, the second clock signal CLK2 may transition from the logic high level to the first logic low level.

In this case, the sixth transistor T6 may be turned on in response to the second clock signal CLK2 of the first logic low level, and the second clock signal CLK2 of the first logic low level may be applied to the first control node QB through the seventh transistor T7 turned on by the second capacitor C2 and the sixth transistor T6 turned on. That is, the first node voltage V_QB may be changed to have the first logic low level.

The ninth transistor T9 may be turned on in response to the first node voltage V_QB of the first logic low level, and the first gate power source voltage VGH may be applied to the output terminal OUT through the first power source input terminal IN1 and the ninth transistor T9. That is, the output voltage V_OUT may be changed to have the logic high level.

As shown in FIG. 8, the output voltage V_OUT (that is, the first compensation gate signal) of the first compensation gate stage GC_ST1_b may be applied to a first compensation gate line GCL1.

Thereafter, even if the first control node QB is in a floating state due to changes in the first clock signal CLK1 and the second clock signal CLK2, the first node voltage V_QB may is be maintained at the first logic low level by the first capacitor C1, and the output voltage V_OUT may be maintained at the logic high level.

The (4_1)th transistor T4_1 may be turned on by the second clock signal CLK2 of the first logic low level, and the first gate power source voltage VGH may be applied to the first electrode of the (3_1)th capacitor C3_1 (or the (14_1)th transistor T14_1). In other words, the first electrode of the (3_1)th capacitor C3_1 (or the (14_1)th transistor T14_1) may be initialized to the first gate power source voltage VGH.

At a fourth time point P4, the input voltage V_IN may change from the logic high level to the first logic low level.

At the fifth time point P5, the first clock signal CLK1 may transition from the logic high level to the first logic low level.

In this case, the first transistor T1 may be turned on in response to the first clock signal CLK1 of the first logic low level, and the input voltage V_IN of the first logic low level may be applied to the first electrode of the twelfth transistor T12. Since the twelfth transistor T12 is turned on by the second gate power source voltage VGL, the input voltage V_IN of the first logic low level may be applied to the second control node Q through the twelfth transistor T12, and the second node voltage V_Q may be changed to a third logic low level (that is, VGL+|Vth|) by a threshold voltage of the twelfth transistor T12.

In this case, the (14_1)th transistor T14_1 may be turned on by the first clock signal CLK1 of the first logic low level, and the (15_1)th transistor T15_1 may be turned on by the input voltage V_IN of the first logic low level. Accordingly, the (3_1)th capacitor C3_1 may indirectly connect the second control node Q and the output terminal OUT via the (14_1)th transistor T14_1 and the (15_1)th transistor T15_1.

Thereafter, the (3_1)th capacitor C3_1 may be charged above a threshold voltage Vth of the tenth transistor T10, and the tenth transistor T10 may be turned on by the first clock signal CLK1 of the first logic low level. Therefore, when the second gate power source voltage VGL is received at the first electrode of the (3_1)th capacitor C3_1, the tenth transistor T10 may be bootstrapped. That is, the second control node Q connected to the gate electrode of the tenth transistor T10 may be boosted with a boosting voltage (that is, the second logic low level (2VGL+|Vth|) at the third logic low level (that is, VGL+|Vth|). The output unit SST2 may stably output the second gate power source voltage VGL as the first compensation gate signal of the logic low level while the second logic low level (2VGL+|Vth|) is applied to the second control node Q.

The eighth transistor T8 may be turned on by the input voltage V_IN of the first logic low level, and the first gate power source voltage VGH may be applied to the first control node QB. That is, the first node voltage V_QB may be changed to have the logic high level.

Furthermore, since the (15_1)th transistor T15_1 is connected in the form of a diode when it is turned on, the voltage of the second control node Q may be maintained constantly regardless of a change in a voltage of the gate electrode of the (14_1)th transistor T14_1. For this reason, the output voltage V_OUT (or the first compensation gate signal) does not have a change in voltage after the fifth time point P5, and a malfunction of the pixel due to the output voltage V_OUT can be prevented.

Figure 9:
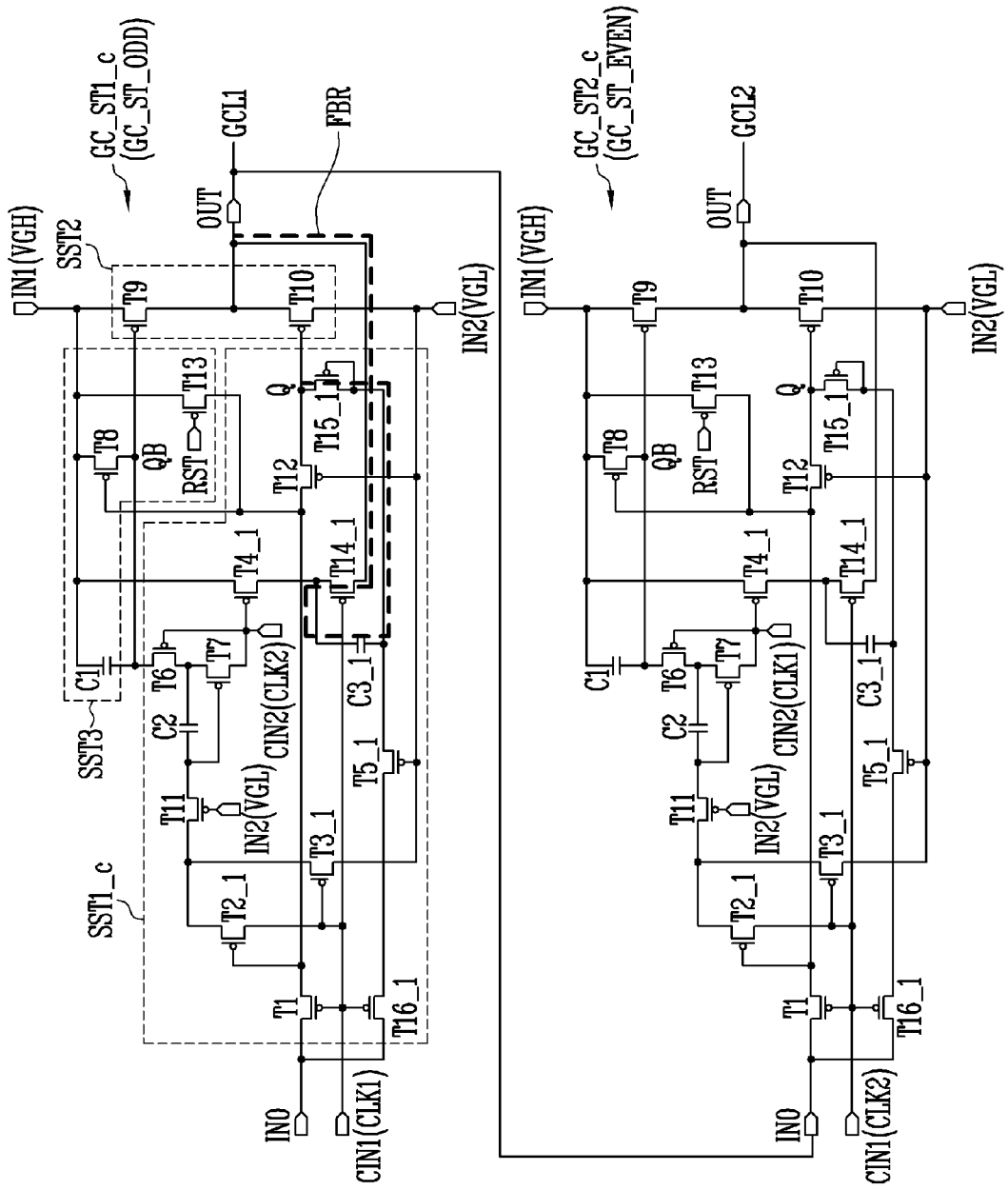
FIG. 9 is a circuit diagram illustrating an example of the first compensation gate stage and the second compensation gate stage included in the compensation gate driver of FIG. 4.

FIG. 9 is a circuit diagram illustrating an example of the first compensation gate stage and the second compensation gate stage included in the compensation gate driver of FIG. 4. Each of the odd-numbered compensation gate stages GC_ST1 and GC_ST3 described with reference to FIG. 4 may be substantially the same as a first compensation gate stage GC_ST1_c, and each of the even-numbered compensation gate stages GC_ST2 and GC_ST4 may be substantially the same as a second compensation gate stage GC_ST2_c.

The embodiment shown in FIG. 9 may be different from the embodiment shown in FIG. 8 in that it further includes a (16_1)th transistor T16_1 (or a third' auxiliary transistor).

Specifically, the (5_1) transistor T5_1 may include a first electrode connected to a second electrode of the (16_1)th transistor T16_1 instead of the second electrode of the first transistor T1, a second electrode connected to the second electrode of the third capacitor C3, and a gate electrode connected to the second power source input terminal IN2. The (16_1)th transistor T16_1 may be formed between the input terminal IN0 and the (5_1)th transistor T5_1, and may include a first electrode connected to the input terminal IN0, a second electrode connected to the first electrode of the (5_1)th transistor T5_1, and a gate electrode connected to the first clock input terminal CIN1.

For this reason, when the (16_1)th transistor T16_1 is turned on by the first clock signal CLK1 of the first low level, since the input voltage V_IN is supplied to the second electrode of the (3_1)th capacitor C3_1 without passing through the junction (that is, the node connected to the gate electrode of the (2_1)th transistor T2_1 of FIG. 8), an effect of initializing the second electrode of the (3_1)th capacitor C3_1 more quickly can be expected.

The display device according to an embodiment may control (that is, boost) the voltage applied to the gate electrode of the pull-down transistor included in the gate driver. Therefore, a deviation in the output of the gate signal can be compensated so that a deviation in luminance due to a change in the gate signal can be reduced or prevented.

However, the effects of the present invention are not limited to the above-described effects, and may be variously extended without departing from the scope of the present is invention.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel that includes gate lines and pixels connected to the gate lines; and
a gate driver that includes a plurality of stages providing gate signals to the gate lines,
wherein a first stage among the plurality of stages includes:
a node controller that includes an input terminal and configured to control a voltage of a first control node and a voltage of a second control node; and
an output unit connected to a first gate power source line and configured to output a first gate power source voltage of the first gate power source line as a gate signal through an output terminal in response to the voltage of the first control node,
wherein the node controller includes a first auxiliary transistor connected in the form of a diode between the input terminal and the second control node and a boosting capacitor connected between the second control node and the output terminal.

2. The display device of claim 1, wherein the voltage of the second control node transitions from a logic high level to a second logic low level lower than a first logic low level at a time point at which a signal applied to a first clock input terminal transitions from the logic high level to the first logic low level during a period in which a signal applied to the input terminal has the first logic low level, and maintains the second logic low level while the signal applied to the input terminal is maintained at the first logic low level.

3. The display device of claim 1, wherein the output unit comprises:
a pull-up transistor that includes a first electrode connected to the first gate power source line, a second electrode connected to the output terminal, and a gate electrode connected to the first control node; and
a pull-down transistor that includes a first electrode connected to the output terminal, a second electrode connected to a second gate power source line, and a gate electrode connected to the second control node.

4. The display device of claim 3, wherein the node controller comprises:
a first clock input terminal and a second clock input terminal;
a first transistor that includes a first electrode connected to the input terminal, a second electrode, and a gate electrode connected to the first clock input terminal;
a second transistor that includes a first electrode connected to the first gate power source line, a second electrode, and a gate electrode;
a third transistor that includes a first electrode connected to the second electrode of the second transistor, a second electrode connected to the second clock input terminal, and a gate electrode connected to a first electrode of the first auxiliary transistor;
a fourth transistor that includes a first electrode connected to the gate electrode of the second transistor, a second electrode connected to the first clock input terminal, and a gate electrode connected to the second electrode of the first transistor;
a fifth transistor that includes a first electrode connected to the first electrode of the fourth transistor, a second electrode connected to the second gate power source line, and a gate electrode connected to the first clock input terminal;
a first coupling transistor that includes a first electrode connected to the first electrode of the fifth transistor, a second electrode, and a gate electrode connected to the second gate power source line;
a first coupling capacitor that includes a first electrode connected to the second electrode of the first coupling transistor, and a second electrode;
a sixth transistor that includes a first electrode connected to the first control node, a second electrode connected to the second electrode of the first coupling capacitor, and a gate electrode connected to the second clock input terminal; and
a seventh transistor that includes a first electrode connected to the second electrode of the first coupling capacitor, a second electrode connected to the second clock input terminal, and a gate electrode connected to the first electrode of the first coupling capacitor.

5. The display device of claim 4, wherein the node controller further comprises:
a second auxiliary transistor that includes a first electrode connected to the input terminal, a second electrode connected to the first electrode of the first auxiliary transistor, and a gate electrode connected to the second gate power source line.

6. The display device of claim 5, wherein the first auxiliary transistor includes the first electrode connected to the gate electrode of the third transistor, a second electrode connected to the second control node, and a gate electrode connected to the gate electrode of the third transistor.

7. The display device of claim 6, wherein the node controller further comprises:
a third auxiliary transistor that includes a first electrode connected to the input terminal, a second electrode connected to the first electrode of the second auxiliary transistor, and a gate electrode connected to the first clock input terminal.

8. The display device of claim 4, wherein the node controller further comprises:
a second coupling capacitor that includes a first electrode connected to the second electrode of the second transistor and a second electrode connected to the gate electrode of the third transistor; and
a second coupling transistor that includes a first electrode connected to the second electrode of the first transistor, a second electrode connected to the second control node, and a gate electrode connected to the second gate power source line.

9. The display device of claim 8, wherein the first stage further comprises:
an eighth transistor that includes a first electrode connected to the first gate power source line, a second electrode connected to the first control node, and a gate electrode connected to the second electrode of the first transistor; and
a first capacitor that includes a first electrode connected to the first gate power source line and a second electrode connected to the first control node.

10. The display device of claim 9, wherein the first stage further comprises:
a reset transistor that includes a first electrode connected to the first gate power source line, a second electrode connected to the second electrode of the first transistor, and a gate electrode connected to a reset line.

11. A display device comprising:
a display panel that includes gate lines and pixels connected to the gate lines; and
a gate driver that includes a plurality of stages providing gate signals to the gate lines, wherein a first stage among the plurality of stages comprises:
a node controller that includes an input terminal and configured to control a voltage of a first control node and a voltage of a second control node; and
an output unit connected to a first gate power source line and configured to output a first gate power source voltage of the first gate power source line as a gate signal through an output terminal in response to the voltage of the first control node,
wherein the node controller includes a feedback path between the output terminal and the second control node, and includes a first auxiliary transistor connected in the form of a diode between the input terminal and the second control node, a boosting capacitor connected between the second control node and the output terminal, and a second auxiliary transistor connected between the output terminal and the boosting capacitor and controlling opening and closing of the feedback path, on the feedback path.

12. The display device of claim 11, wherein the voltage of the second control node transitions from a logic high level to a second logic low level lower than a first logic low level when a signal applied to a first clock input terminal transitions from the logic high level to the first logic low level during a period in which a signal applied to the input terminal has the first logic low level, and maintains the second logic low level while the signal applied to the input terminal is maintained at the first logic low level.

13. The display device of claim 11, wherein the output unit comprises:
a pull-up transistor that includes a first electrode connected to the first gate power source line, a second electrode connected to the output terminal, and a gate electrode connected to the first control node; and
a pull-down transistor that includes a first electrode connected to the output terminal, a second electrode connected to a second gate power source line, and a gate electrode connected to the second control node.

14. The display device of claim 13, wherein the node controller further comprises:
a first clock input terminal and a second clock input terminal;
a first transistor that includes a first electrode connected to the input terminal, a second electrode, and a gate electrode connected to the first clock input terminal;
a second transistor that includes a first electrode, a second electrode connected to the first clock input terminal, and a gate electrode connected to the second electrode of the first transistor;
a third transistor that includes a first electrode connected to the first electrode of the second transistor, a second electrode connected to the second gate power source line, and a gate electrode connected to the second electrode of the second transistor;
a fourth transistor that includes a first electrode connected to the first gate power source line, a second electrode connected to a first electrode of the second auxiliary transistor, and a gate electrode connected to the second clock input terminal;
a first coupling transistor that includes a first electrode connected to the first electrode of the third transistor, a second electrode, and a gate electrode connected to the second gate power source line;
a first coupling capacitor that includes a first electrode connected to the second electrode of the first coupling transistor, and a second electrode;

a sixth transistor that includes a first electrode connected to the first control node, a second electrode connected to the second electrode of the first coupling capacitor, and a gate electrode connected to the second clock input terminal; and
a seventh transistor that includes a first electrode connected to the second electrode of the first coupling capacitor, a second electrode connected to the second clock input terminal, and a gate electrode connected to the first electrode of the first coupling capacitor.

15. The display device of claim 14, further comprising:
a fifth transistor that includes a first electrode connected to the second electrode of the first transistor, a second electrode connected to a second electrode of the first auxiliary transistor, and a gate electrode connected to the second gate power source line.

16. The display device of claim 15, wherein the first auxiliary transistor includes a first electrode connected to the second control node, the second electrode connected to the second electrode of the fifth transistor, and a gate electrode connected to the second electrode of the fifth transistor, and
wherein the second auxiliary transistor includes the first electrode connected to the second electrode of the fourth transistor, a second electrode connected to the output terminal, and a gate electrode connected to the first clock input terminal.

17. The display device of claim 16, wherein the boosting capacitor includes a first electrode connected to the first electrode of the second auxiliary transistor and a second electrode connected to the second electrode of the first auxiliary transistor.

18. The display device of claim 14, wherein the node controller further comprises:
a fifth transistor that includes a first electrode, a second electrode connected to the second electrode of the first auxiliary transistor, and a gate electrode connected to the second gate power source line; and
a third auxiliary transistor that includes a first electrode connected to the input terminal, a second electrode connected to the first electrode of the fifth transistor, and a gate electrode connected to the first clock input terminal.

19. The display device of claim 15, wherein the node controller further comprises:
a second coupling transistor that includes a first electrode connected to the second electrode of the first transistor, a second electrode connected to the second control node, and a gate electrode connected to the second gate power source line.

20. The display device of claim 19, wherein the first stage further comprises:
an eighth transistor that includes a first electrode connected to the first gate power source line, a second electrode connected to the first control node, and a gate electrode connected to the second electrode of the first transistor;
a first capacitor that includes a first electrode connected to the first gate power source line and a second electrode connected to the first control node; and
a reset transistor that includes a first electrode connected to the first gate power source line, a second electrode connected to the second electrode of the first transistor, and a gate electrode connected to a reset line.

* * * * *